US012609139B2

(12) United States Patent
Huang

(10) Patent No.: US 12,609,139 B2
(45) Date of Patent: Apr. 21, 2026

(54) ELECTRONIC MODULE AND HEAT DISSIPATION ASSEMBLY

(71) Applicant: PEGATRON CORPORATION, Taipei City (TW)

(72) Inventor: Yu-Yang Huang, Taipei City (TW)

(73) Assignee: PEGATRON CORPORATION, Taipei City (TW)

( * ) Notice: Subject to any disclaimer, the term of this patent is extended or adjusted under 35 U.S.C. 154(b) by 208 days.

(21) Appl. No.: 18/540,858

(22) Filed: Dec. 14, 2023

(65) Prior Publication Data

US 2024/0304221 A1 Sep. 12, 2024

(30) Foreign Application Priority Data

Mar. 7, 2023 (TW) ................................. 112201985

(51) Int. Cl.
 *H05K 7/20* (2006.01)
 *G11B 33/14* (2006.01)
(52) U.S. Cl.
 CPC ..... *G11B 33/1426* (2013.01); *H05K 7/20509* (2013.01)
(58) Field of Classification Search
 CPC .......... H05K 7/20154; H05K 7/20909; H05K 7/20509; G11B 33/1426
 See application file for complete search history.

(56) References Cited

U.S. PATENT DOCUMENTS

| | | | | |
|---|---|---|---|---|
| 4,593,342 | A | * | 6/1986 | Lindsay .............. H01L 23/4006 361/720 |
| 4,914,551 | A | * | 4/1990 | Anschel .............. H01L 23/3737 257/713 |
| 7,567,439 | B2 | * | 7/2009 | Li ........................ H01L 23/4006 361/717 |
| 2004/0001315 | A1 | * | 1/2004 | Li ........................ H01L 23/4093 257/E23.099 |
| 2005/0276021 | A1 | * | 12/2005 | Gates .................. H01L 23/3672 361/709 |
| 2007/0195489 | A1 | * | 8/2007 | Lai ........................ G11C 5/143 361/600 |
| 2009/0154100 | A1 | * | 6/2009 | Li ........................ H01L 23/467 361/697 |

FOREIGN PATENT DOCUMENTS

| | | |
|---|---|---|
| CN | 210573546 | 5/2020 |
| TW | 202021449 | 6/2020 |

* cited by examiner

*Primary Examiner* — Jacob R Crum
(74) *Attorney, Agent, or Firm* — J.C. PATENTS

(57) ABSTRACT

An electronic module and a heat dissipation assembly thereof are provided. The electronic module includes an electronic component between a bottom of a heat fin and a bottom plate of a base, and a heat dissipation assembly including the heat fin, the base, and multiple fasteners. Each of two opposite sides of the bottom has a pair of first and second screw holes. The first screw holes are between the second screw holes. The base has a pair of side walls extending vertically from opposite sides of the bottom plate. Each side wall has a pair of third and fourth screw holes. The third screw holes correspond to the first screw holes and the fourth screw holes correspond to the second screw holes. The fasteners pass through the corresponding third and first screw holes or pass through the corresponding fourth and second screw holes.

5 Claims, 3 Drawing Sheets

ELECTRONIC MODULE AND HEAT DISSIPATION ASSEMBLY

CROSS-REFERENCE TO RELATED APPLICATION

This application claims the priority benefit of Taiwan application serial no. 112201985, filed on Mar. 7, 2023. The entirety of the above-mentioned patent application is hereby incorporated by reference herein and made a part of this specification.

BACKGROUND

Technical Field

The disclosure relates to a module and an assembly, and in particular to an electronic module and a heat dissipation assembly thereof.

Description of Related Art

In electronic modules, fasteners are commonly used to clamp the electronic component and the heat dissipation assembly. Alternatively, the upper and lower components are screwed together through screw holes from sides.

Taking external interface hard disks as an example, a designated heat dissipation assembly is usually used for heat dissipation for the external interface hard disks. Due to the diverse specifications, the interface hard disks may be roughly divided into two specifications, single-sided chip and double-sided chip. Therefore, for the fastening method mentioned above, if the user replaces an interface hard disk with another interface hard disk with a different specification, changes in thickness due to different specifications of single sided chip and double-sided chip may cause the upper screw holes and the lower screw holes of the heat dissipation assembly not able to align, and therefore the heat dissipation assembly is not fastened properly. Or a heat dissipation component may have a contact issue with the heat source of the hard disk chip and cannot dissipate the heat effectively, and the interface hard disk is prone to overheat and be damaged.

SUMMARY

The disclosure provides a heat dissipation assembly which can be suitable for electronic components in different sizes.

The disclosure provides an electronic module which can be suitable for electronic components in different sizes.

The heat dissipation assembly includes a heat fin, a base, and a plurality of fasteners. The heat fin has a bottom and a plurality of fins vertically arranged on the bottom. Each side of the bottom has a pair of first screw holes and a pair of second screw holes. The first screw holes are between the second screw holes. The base has a bottom plate and a pair of side walls, and the side walls extend vertically from two opposite sides of the bottom plate, and each side wall has a pair of third screw holes and a pair of fourth screw holes. Positions of the third screw holes correspond to positions of the first screw holes and positions of the fourth screw holes correspond to positions of the second screw holes. The fasteners pass through the corresponding pairs of third screw holes and the first screw holes or pass through the corresponding pairs of fourth screw holes and the second screw holes.

The electronic module according to the embodiment of the disclosure includes the heat dissipation assembly mentioned above and an electronic component disposed between the bottom of the heat fin and the bottom plate of the base.

In an embodiment according to the disclosure, the pair of first screw holes and the pair of second screw holes have the same height in an extending direction of the fins.

In an embodiment according to the disclosure, the pair of third screw holes and the pair of fourth screw holes have different heights from the bottom plate.

In an embodiment according to the disclosure, the base further has a stopper wall extending vertically from the another side of the bottom plate, and the another side is different from the sides of the side walls.

In an embodiment according to the disclosure, the electronic module further includes at least one heat conductive plate disposed between the electronic component and the bottom or between the electronic component and the bottom plate.

Based on the above, in the heat dissipation assembly and the electronic module using the heat dissipation assembly according to the embodiments of the disclosure, since multiple pairs of screw holes are disposed on the bottom of the heat fin, and corresponding pairs of screw holes are disposed on the bottom plate of the base, the distance between the bottom of the heat fin and the bottom plate of the base can vary in response to the thickness of the electronic component disposed therein by screwing the fasteners into different corresponding screw holes to change the position of the heat fin at the base.

DESCRIPTION OF THE EMBODIMENTS

Figure 1:
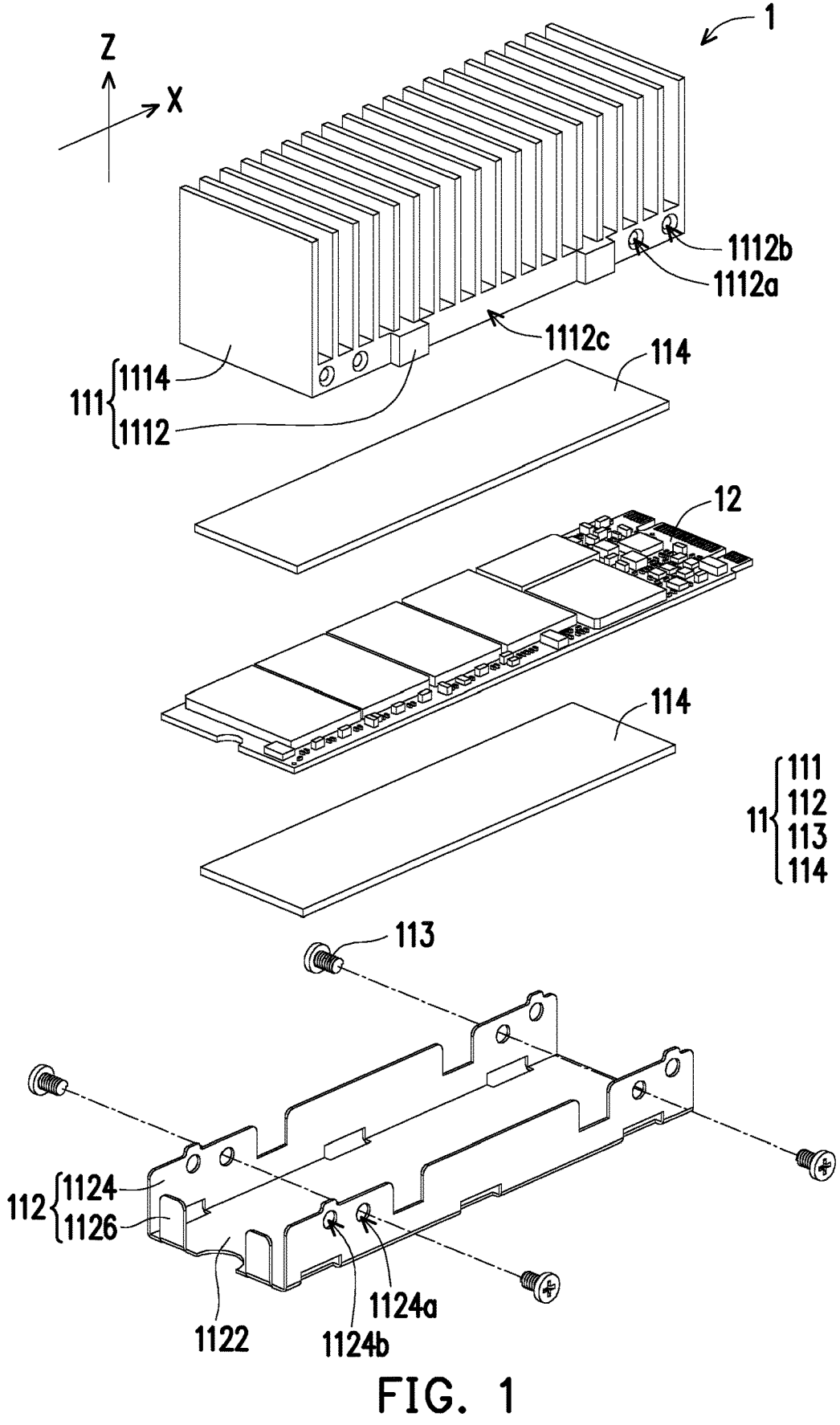
FIG. 1 is a schematic exploded view of an electronic module according to an embodiment of the disclosure.
Figures 2A, 2B:
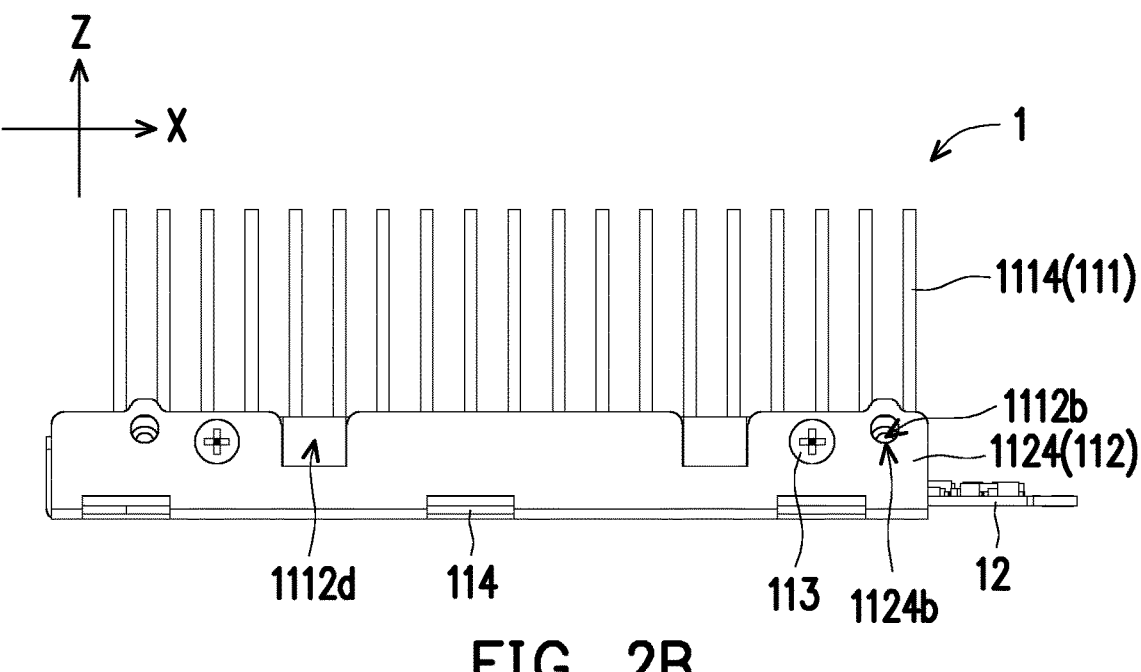
FIG. 2A is a schematic exploded view of an electronic module with an electronic component in conformity with a single-sided chip specification.
FIG. 2B is a schematic front view of the electronic module in FIG. 2A after assembly.

FIG. 1 is a schematic exploded view of an electronic module according to an embodiment of the disclosure. FIG. 2A is a schematic exploded view of an electronic module with an electronic component in conformity with a single-sided chip specification, and FIG. 2B is a schematic front view of the electronic module in FIG. 2A after assembly.

Please refer to FIG. 1, FIG. 2A, and FIG. 2B together. An electronic module 1 according to the disclosure includes a heat dissipation assembly 11 and an electronic component 12. The heat dissipation assembly 11 includes a heat fin 111, a base 112, and multiple fasteners 113. The heat fin 111 has a bottom 1112 and multiple fins 1114. The fins 1114 are vertically arranged on the bottom 1112. Each of two opposite sides 1112c and 1112d of the bottom 1112 has a pair of first screw holes 1112a and a pair of second screw holes 1112b. The first screw holes 1112a are between the second screw holes 1112b. The base 112 has a bottom plate 1122 and a pair of side walls 1124. The side walls 1124 extend vertically from two opposite sides of the bottom plate 1122, and each side wall 1124 has a pair of third screw holes 1124a and a pair of fourth screw holes 1124b. The positions of the third screw holes 1124a correspond to the positions of the first screw holes 1112a, and the positions of the fourth screw holes 1124b correspond to the positions of the second screw holes 1112b. The fasteners 113 pass through the corresponding pairs of third screw holes 1124a and the first screw holes 1112a or pass through the corresponding pairs of fourth screw holes 1124b and the second screw holes 1112b. The electronic component 12 is disposed between the bottom 1112 of the heat fin 111 and the bottom plate 1122 of the base 112.

It may be known from the above that in the heat dissipation assembly 11, the screw holes which the fasteners 113 pass through are chosen to correspond to the thickness of the electronic component 12, so that the electronic component 12 is fastened well. Therefore, the heat fin 111 and the base 112 may attach to the electronic component 12 closely to dissipate heat, so as to achieve the optimal heat dissipation efficiency.

Based on the above, in this embodiment, in an extending direction Z of the fins 1114, the first screw holes 1112a and the second screw holes 1112b have the same height. In addition, it may be known from the above that the first screw holes 1112a and the second screw holes 1112b have different positions in the direction X where the fins 1114 are arranged.

In addition, the third screw holes 1124a and the fourth screw holes 1124b have different heights from the bottom plate 1122 (the same direction as the extending direction Z of the fin 1114), to be more specific, the third screw holes 1124a are lower than the fourth screw holes 1124b.

Specifically, the electronic component 12 of this embodiment is an interface hard disk, which may comply with one of the two specifications, single-sided chip and double-sided chip. The thickness of the electronic component 12 in conformity with the single-sided chip specification is smaller than the thickness of the electronic component 12 in conformity with the double-sided chip specification.

Please continue to refer to FIG. 1, FIG. 2A, and FIG. 2B together. When the electronic component 12 in conformity with the single-sided chip specification is used, the electronic component 12 is placed in a space (not shown) jointly formed by the bottom plate 1122 of the base 112 and the side walls 1124. Next, the heat fin 111 is placed on the electronic component 12. Since the overall thickness of the electronic component 12 in conformity with the single-sided chip specification is thinner, the fasteners 113 are passed through the third screw holes 1124a which is lower in the height direction on the side wall 1124 of the base 112 and are screwed into the first screw holes 1112a corresponding to the third screw holes 1124a. In this way, the base 112, from the bottom of the electronic component 12, and the heat fin 111, from the top of the electronic component 12, both attach to the electronic component 12 closely, so as to achieve good heat dissipation.

Incidentally, the base 112 further has a stopper wall 1126 extending vertically from another side different from the side of the side wall 1124 of the bottom plate 1122. The extending direction Z of the stopper wall 1126 is in the same direction as the extending direction Z of the side wall 1124. Therefore, the stopper wall 1126, the side walls 1124, and the bottom plate 1122 jointly form the space (not shown), and the stopper wall 1126 can perform blocking to prevent the electronic component 12 from falling off from a side of the base 112 without the side wall 1124.

In addition, in order to enhance the heat dissipation of the heat dissipation assembly 11, the heat dissipation assembly

11 may further include a heat conductive plate 114. In this embodiment, the quantity of the heat conductive plates 114 is two, and the heat conductive plates 114 are disposed between the electronic component 12 and the bottom 1112, and between the electronic component 12 and the bottom plate 1122. The quantity of the heat conductive plate 114 may be selected according to practical requirements.

Figures 3A, 3B:
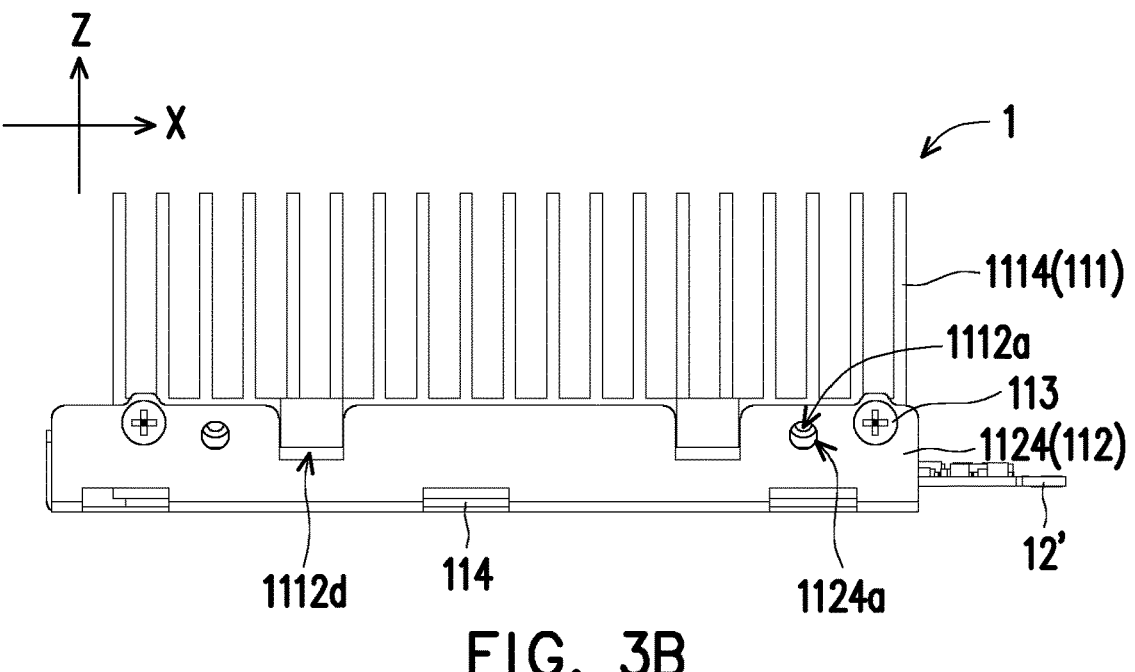
FIG. 3A is a schematic exploded view of an electronic module with an electronic component in conformity with a double-sided chip specification.
FIG. 3B is a schematic front view of the electronic module in FIG. 3A after assembly.

FIG. 3A is a schematic exploded view of an electronic module with an electronic component in conformity with a double-sided chip specification, and FIG. 3B is a schematic front view of the electronic module in FIG. 3A after assembly.

Please refer to FIG. 1, FIG. 3A and FIG. 3B together. When an electronic component 12' of a double-sided chip specification is used, the electronic component 12' is placed in a space (not shown) jointly formed by the bottom plate 1122 of the base 112 and the side wall 1124. Next, the heat fin 111 is placed on the electronic component 12'. Since the overall thickness of the electronic component 12' in conformity with the double-sided chip specification is thicker, the fasteners 113 are passed through the fourth screw holes 1124b which is higher in the height direction (the same direction as the extending direction Z of the fins 1114) on the side wall 1124 of the base 112 and are screwed into the second screw holes 1112b corresponding to the fourth screw holes 1124b.

It is worth mentioning that the third screw holes 1124a and the fourth screw holes 1124b are staggered not only in the height direction (the same direction as the extending direction Z of the fin 1114) but also in the longitudinal direction of the base 112 (the same direction as the arranged direction X of the fins 1114). The configuration in which the third screw holes 1124a and the fourth screw holes 1124b are staggered in the longitudinal direction (the same direction as the direction X in which the fins 1114 are arranged) of the base 112 may reduce the height of the side wall 1124 of the base 112 and save materials, compared to the configuration in which the third screw hole 1124a and the fourth screw hole 1124b are not staggered in the longitudinal direction (the same direction as the direction X in which the fins 1114 are arranged) of the base 112.

Incidentally, according to this embodiment, although four pairs of screw holes are disposed on the bottom of the heat fin (two pairs of screw holes disposed on each side), and four corresponding pairs of screw holes are disposed on the bottom plate of the base (two pairs of corresponding screw holes disposed on each side wall), the disclosure is not limited thereto. The quantity of screw holes may be changed according to practical requirements.

In summary, according to the embodiments of the disclosure the heat dissipation assembly and the electronic module with the heat dissipation assembly may have different distances between the bottom of the heat fin and the bottom plate of the base due to the thickness of the electronic component which is disposed through the corresponding screw holes by the fasteners. Therefore, the heat dissipation assembly and the electronic module with the heat dissipation assembly according to the disclosure have the advantage of being suitable for electronic components in conformity with different specifications.

What is claimed is:
1. A heat dissipation assembly, comprising:
a heat fin having a bottom and a plurality of fins, wherein the fins are vertically arranged on the bottom, each of two opposite sides of the bottom has a pair of first screw holes and a pair of second screw holes, and the pair of first screw holes are between the pair of second screw holes;

a base having a bottom plate and a pair of side walls, wherein the pair of side walls extend vertically from two opposite sides of the bottom plate, each of the side walls has a pair of third screw holes and a pair of fourth screw holes, and positions of the pair of third screw holes correspond to positions of the pair of first screw holes and positions of the pair of fourth screw holes correspond to positions of the pair of second screw holes; and a plurality of fasteners, passing through the corresponding pairs of third screw holes and first screw holes or passing through the corresponding pairs of fourth screw holes and second screw holes, wherein the pair of third screw holes and the pair of fourth screw holes have different heights from the bottom plate, wherein the pair of first screw holes and the pair of second screw holes have a same height in an extending direction of the fins.

2. The heat dissipation assembly as claimed in claim 1, wherein the base further has a stopper wall extending vertically from another side of the bottom plate, and the another side is different from the sides of the side walls.

3. An electronic module, comprising:
a heat dissipation assembly, comprising:
  a heat fin having a bottom and plurality of fins, wherein the fins are vertically arranged on the bottom, each of two opposite sides of the bottom has a pair of first screw holes and a pair of second screw holes, and the pair of first screw holes are between the pair of second screw holes;

a base having a bottom plate and a pair of side walls, wherein the pair of side walls extend vertically from two opposite sides of the bottom plate, each of the side walls has a pair of third screw holes and a pair of fourth screw holes, and positions of the pair of third screw holes correspond to positions of the pair of first screw holes and positions of the pair of fourth screw holes correspond to positions of the pair of second screw holes;

a plurality of fasteners, passing through the corresponding pairs of third screw holes and first screw holes or passing through the corresponding pairs of fourth screw holes and second screw holes; and an electronic component disposed between the bottom of the heat fin and the bottom plate of the bases, wherein the pair of third screw holes and the pair of fourth screw holes have different heights from the bottom plate, wherein the pair of first screw holes and the pair of second screw holes have a same height in an extending direction of the fins.

4. The electronic module as claimed in claim 3, wherein the base further has a stopper wall extending vertically from another side of the bottom plate, and the another side is different from the sides of the side walls.

5. The electronic module as claimed in claim 3 further comprises at least one heat conductive plate disposed between the electronic component and the bottom or between the electronic component and the bottom plate.

\* \* \* \* \*